(12) United States Patent
Nakagomi

(10) Patent No.: US 10,020,804 B2
(45) Date of Patent: Jul. 10, 2018

(54) OUTPUT STAGE BUFFER CIRCUIT

(71) Applicant: FUJI ELECTRIC CO., LTD., Kawasaki, Kanagawa (JP)

(72) Inventor: Kenji Nakagomi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/662,442

(22) Filed: Jul. 28, 2017

(65) Prior Publication Data

US 2018/0091139 A1    Mar. 29, 2018

(30) Foreign Application Priority Data

Sep. 28, 2016   (JP) .................. 2016-189447

(51) Int. Cl.
*H03K 17/567*   (2006.01)
*H03K 17/687*   (2006.01)

(52) U.S. Cl.
CPC ....... *H03K 17/6872* (2013.01); *H03K 17/567* (2013.01)

(58) Field of Classification Search
CPC .................. H03K 17/6872; H03K 17/567
USPC ........................................ 327/527
See application file for complete search history.

(56) References Cited

U.S. PATENT DOCUMENTS

| 5,369,354 | A | * | 11/1994 | Mori | ................. | G05F 3/24 |
| | | | | | | 323/313 |
| 5,729,178 | A | * | 3/1998 | Park | ................. | H03F 1/0261 |
| | | | | | | 330/253 |
| 7,031,127 | B1 | * | 4/2006 | D'Aquino | ................. | H03F 1/52 |
| | | | | | | 361/58 |
| 2002/0175904 | A1 | * | 11/2002 | Matsumoto | .......... | G09G 3/3685 |
| | | | | | | 345/204 |
| 2008/0278232 | A1 | * | 11/2008 | Sung | .................... | H03F 3/3022 |
| | | | | | | 330/255 |
| 2010/0013449 | A1 | * | 1/2010 | Miki | ........................ | G05F 1/56 |
| | | | | | | 323/282 |
| 2015/0236674 | A1 | * | 8/2015 | Thakur | .......... | H03K 19/018521 |
| | | | | | | 327/108 |

(Continued)

FOREIGN PATENT DOCUMENTS

JP       H07-202667 A    8/1995

*Primary Examiner* — Ryan Jager
(74) *Attorney, Agent, or Firm* — Rabin & Berdo, P.C.

(57) ABSTRACT

An output stage buffer circuit including a first P-channel Metal-Oxide-Semiconductor Field-Effect Transistor (MOSFET), first to third N-channel MOSFETs, a constant-voltage circuit and a bias circuit. A source of the first P-channel MOSFET is connected to a power supply terminal. A source and a drain of the first N-channel MOSFET are respectively connected to a ground terminal and an output terminal. The first N-channel and P-channel MOSFETs constitute a push-pull circuit. The second N-channel MOSFET is disposed between a drain of the first P-channel MOSFET and a connection point between the drain of the first N-channel MOSFET and the output terminal. A source and a drain of the third N-channel MOSFET respectively receive from the constant-voltage circuit a constant voltage lower than a voltage received at the power supply terminal, and from the bias circuit a constant current. The second and third N-channel MOSFETs constitute a current mirror circuit.

8 Claims, 7 Drawing Sheets

(56) References Cited

U.S. PATENT DOCUMENTS

2017/0194953 A1* 7/2017 Huang .................... H03K 5/01
2017/0324324 A1* 11/2017 Ballarin ................. H02M 1/08

* cited by examiner

OUTPUT STAGE BUFFER CIRCUIT

CROSS-REFERENCE TO RELATED APPLICATION

This application is based upon and claims the benefit of priority of the prior Japanese Patent Application No. 2016-189447, filed on Sep. 28, 2016, the entire contents of which are incorporated herein by reference.

BACKGROUND OF THE INVENTION

1. Field of the Invention

The embodiments discussed herein are related to an output stage buffer circuit that clamps an upper limit of an output voltage, which is outputted by a semiconductor device used to perform on-off drive on a switching power element, at a voltage lower than a power supply voltage.

2. Background of the Related Art

A flyback converter is known which serves as a switching power supply apparatus that generates a direct-current voltage from a voltage from an alternating-current power supply. The flyback converter has a configuration in which a direct-current voltage obtained by rectifying the voltage from the alternating-current power supply is received by a series circuit constituted by a primary winding of an output transformer and a switching power element, and in which the switching power element is turned on and off. With this configuration, a pulsating current occurs in a secondary winding of the output transformer, and is rectified and smoothed to generate a direct-current voltage. To perform on-off control on the switching power element, an integrated semiconductor device is used as a control circuit. The semiconductor device has an output stage buffer circuit at its final stage, and the output stage buffer circuit outputs a signal used to perform on-off drive on the switching power element.

The output stage buffer circuit has a driver that receives an on-off control signal, and a drive circuit that is driven by the driver and outputs a signal used to drive the switching power element. For example, the drive circuit has two output transistors connected in series or two complementary output transistors. In the drive circuit, the two output transistors are turned on or off alternately, to output a signal with a voltage close to a power supply voltage or with an electric potential close to the ground potential, to an output terminal.

Commonly, the switching power element uses an N-channel power Metal-Oxide-Semiconductor Field-Effect Transistor (MOSFET, hereinafter referred to as a MOS transistor). The power MOS transistor is typically turned on when a gate voltage is higher than a threshold voltage, and is turned off when the gate voltage is lower than the threshold voltage. Here, the threshold voltage over which the power MOS transistor is turned on is less than 10 volts (V). To sufficiently reduce an on-resistance of the power MOS transistor, the gate voltage needs to be sufficiently higher than the threshold voltage, within a range of the withstand voltage between the gate and the source. By the way, power MOS transistors are classified into two groups: a group in which the withstand voltage between the gate and the source is 20V or less; and a group in which the withstand voltage between the gate and the source is higher than 20V. The power MOS transistors having a withstand voltage higher than 20V are expensive due to their structure.

In the case where a power supply voltage of 20V or less is supplied to the drive circuit of the output stage buffer circuit, an inexpensive power MOS transistor is usable. However, in the case where a power supply voltage of higher than 20V is supplied to the drive circuit, an expensive power MOS transistor is used.

For this, there is a demand for using an inexpensive power MOS transistor with a withstand voltage of 20V or less between the gate and the source, even in the case where a power supply voltage of higher than 20V is supplied to the drive circuit. For this demand, a technique is known which clamps a voltage, which is supplied to the drive circuit, at a voltage lower than the power supply voltage (for example, see Japanese Laid-open Patent Publication No. 7-202667).

FIG. 7 illustrates an example of a drive circuit of a conventional output stage buffer circuit.

The output stage buffer circuit illustrated in FIG. 7 is a main part of a circuit disclosed in Japanese Laid-open Patent Publication No. 7-202667. A power MOS transistor 100 that serves as the switching power element is driven by a drive circuit 101. A terminal of the drive circuit 101 on a power supply side is connected to a power supply line 103 via a clamp circuit 102. The clamp circuit 102 is constituted by two Darlington-connected NPN transistors 102a and 102b. The collectors of the NPN transistors 102a and 102b are connected to the power supply line 103; the emitter of the NPN transistor 102b is connected to the terminal of the drive circuit 101 on the power supply side. The base of the NPN transistor 102a is connected to the output terminal of a reference voltage circuit 104. The reference voltage circuit 104 outputs a voltage, as a reference voltage, which is generated from a power supply voltage from the power supply line 103 and which is lower than the power supply voltage.

When a control signal for turning on the power MOS transistor 100 is inputted to the drive circuit 101, a gate voltage is applied to the gate of the power MOS transistor 100. The gate voltage is not the power supply voltage, but a voltage clamped by the clamp circuit 102. Since the clamp circuit 102 is an emitter follower, the emitter of the NPN transistor 102b has a voltage obtained by subtracting a total voltage drop value of two diodes from the reference voltage that is outputted from the reference voltage circuit 104.

This allows the gate voltage of the power MOS transistor 100 to be 20V or less, by setting the reference voltage of the reference voltage circuit 104 at 20V or less, even in the case where the power supply voltage of the output stage buffer circuit, including the drive circuit 101, is higher than 20V.

By the way, if the clamp circuit is manufactured through a MOS semiconductor process mainly used today, merely replacing the Darlington-connected bipolar transistors by an N-channel MOS transistor causes the following problem. That is, because the N-channel MOS transistor is disposed on the power source side with respect to the drive circuit, and because a back gate (substrate) potential of the N-channel MOS transistor is lower than a source potential of the N-channel MOS transistor, the N-channel MOS transistor causes a substrate effect, which is not caused by the bipolar transistors. In the substrate effect, when a substrate (well) voltage is lower than a source voltage (in the case where an N-channel MOS transistor is used), the larger the voltage between the source and the substrate is, the larger the threshold voltage becomes.

Here, suppose that the power MOS transistor is to be turned on. Where an output voltage from an output stage buffer circuit is VOUT, the reference voltage of the reference voltage circuit is VREF (e.g. 15V), and the threshold voltage of the N-channel MOS transistor, used in place of the Darlington-connected bipolar transistors, is Vth, the output voltage VOUT is expressed as VOUT≈VREF−Vth, because the N-channel MOS transistor constitutes a source follower circuit. In this case, since the substrate voltage equals 0V and the source voltage equals VOUT, the voltage between the source and the substrate is VOUT. If the gate voltage of the N-channel MOS transistor almost equals the reference voltage (VREF≈15V), then the threshold voltage Vth almost equals 7V (Vth≈7V) and the output voltage VOUT almost equals 8V (VOUT≈8V) due to the substrate effect. Because an increased substrate effect considerably increases the voltage drop between the gate and the source, the output voltage VOUT is lowered. As a result, it becomes difficult to reliably turn on the power MOS transistor. Thus, the voltage between the source and the substrate, which produces the substrate effect, varies depending on the reference voltage VREF of the reference voltage circuit. So, the reference voltage VREF and the voltage between the source and the substrate, which produces the substrate effect, are adjusted (controlled) to each other. In addition, as the reference voltage VREF and the substrate effect are influenced by, for example, variations in a process, the output voltage VOUT is unavoidably varied. This increases possibility of the output voltage VOUT being outside a range in specifications, in which the power MOS transistor is turned on.

The substrate effect may be eliminated by connecting the source and the back gate of the N-channel MOS transistor. In this case, however, an electric potential of a semiconductor region (P-well) in which the N-channel MOS transistor is formed becomes equal to the electric potential of the back gate (substrate) of the N-channel MOS transistor. As a result, since the electric potential of the semiconductor region (P-well) becomes VOUT, only the semiconductor region, in which the N-channel MOS transistor is formed, is separated and electrically isolated from other semiconductor regions (i.e. P-wells connected to a power supply terminal on a lower potential side) in which other N-channel MOS transistors are formed. In this case, the chip size of the semiconductor device including the output stage buffer circuit will be increased, increasing the cost of the semiconductor device.

SUMMARY OF THE INVENTION

In one aspect of the embodiments, there is provided an output stage buffer circuit that includes a first P-channel MOSFET disposed on a power supply side; a first N-channel MOSFET disposed on a ground side and constituting a push-pull circuit along with the first P-channel MOSFET; a second N-channel MOSFET disposed between the drain of the first P-channel MOSFET and a connection point between the drain of the first N-channel MOSFET and an output terminal; a third N-channel MOSFET that is in a diode configuration and constitutes a current mirror circuit along with the second N-channel MOSFET; a constant-voltage circuit that supplies a constant voltage to a source of the third N-channel MOSFET, the constant voltage being lower than a power supply voltage; and a bias circuit that supplies a constant current to the third N-channel MOSFET.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, some embodiments will be described in detail with reference to the accompanying drawings, with examples in which the embodiments are applied to a switching power supply apparatus that is constituted by a flyback converter and is controlled in a current mode. Note that each embodiment is embodied, partially combined with a plurality of other embodiments as long as there is no contradiction between them. In the following description, a name of an identical terminal, a voltage at an identical terminal, a signal from an identical terminal, and the like may be each denoted by an identical symbol.

Figure 1:
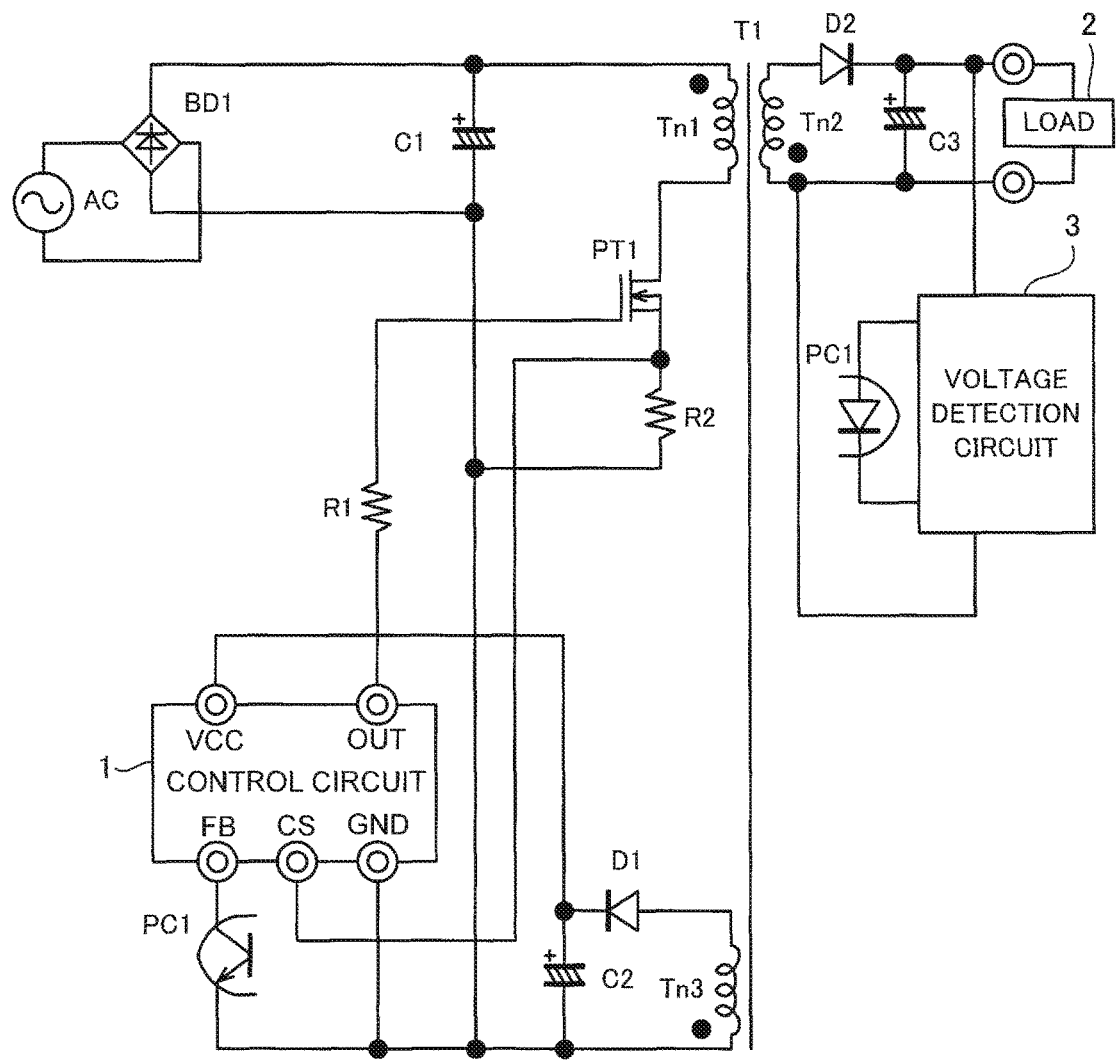
FIG. 1 illustrates an example of a configuration of a switching power supply apparatus to which the embodiments discussed herein are applied.
Figure 2:
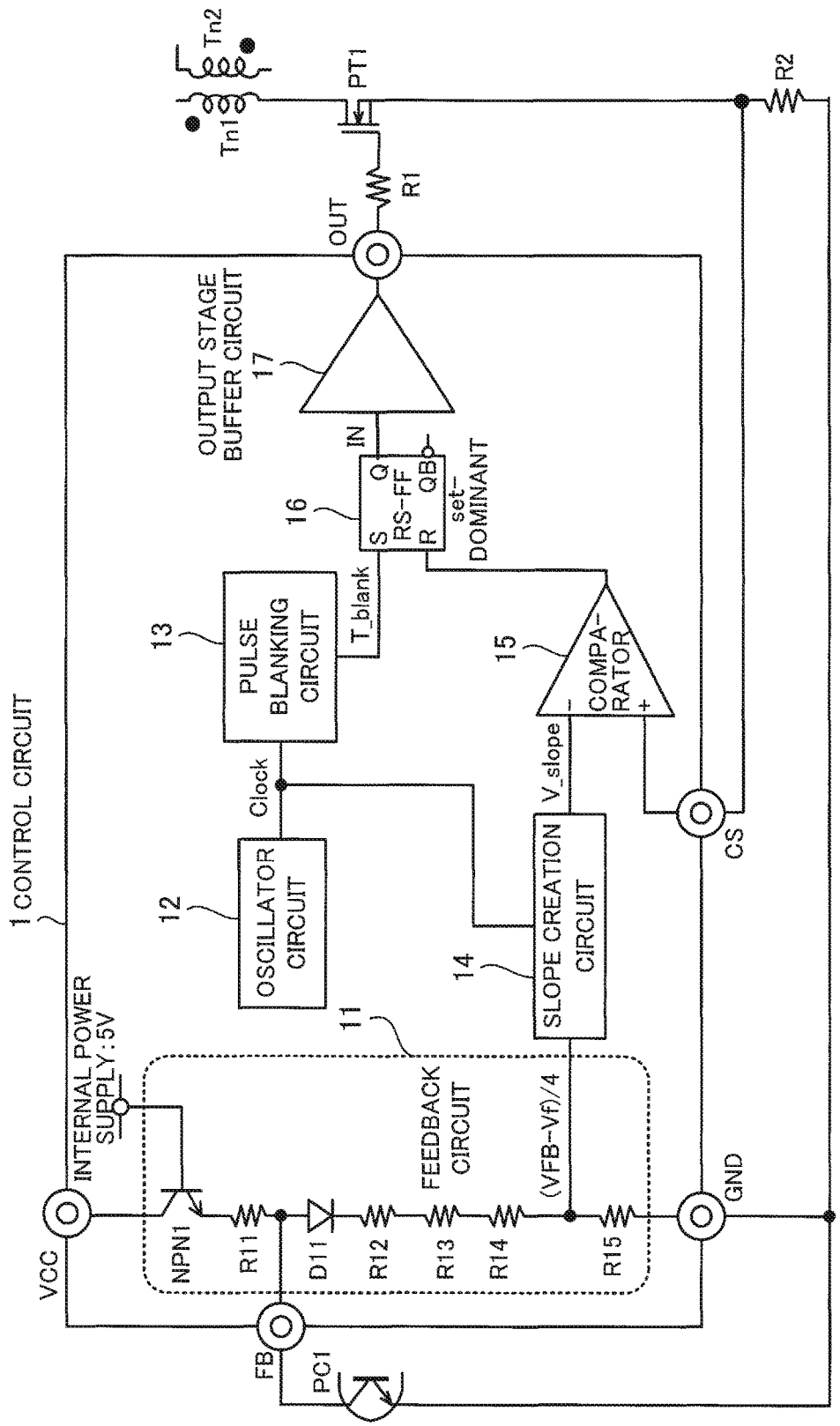
FIG. 2 is a block diagram illustrating an example of a configuration of a control circuit.
Figure 3:
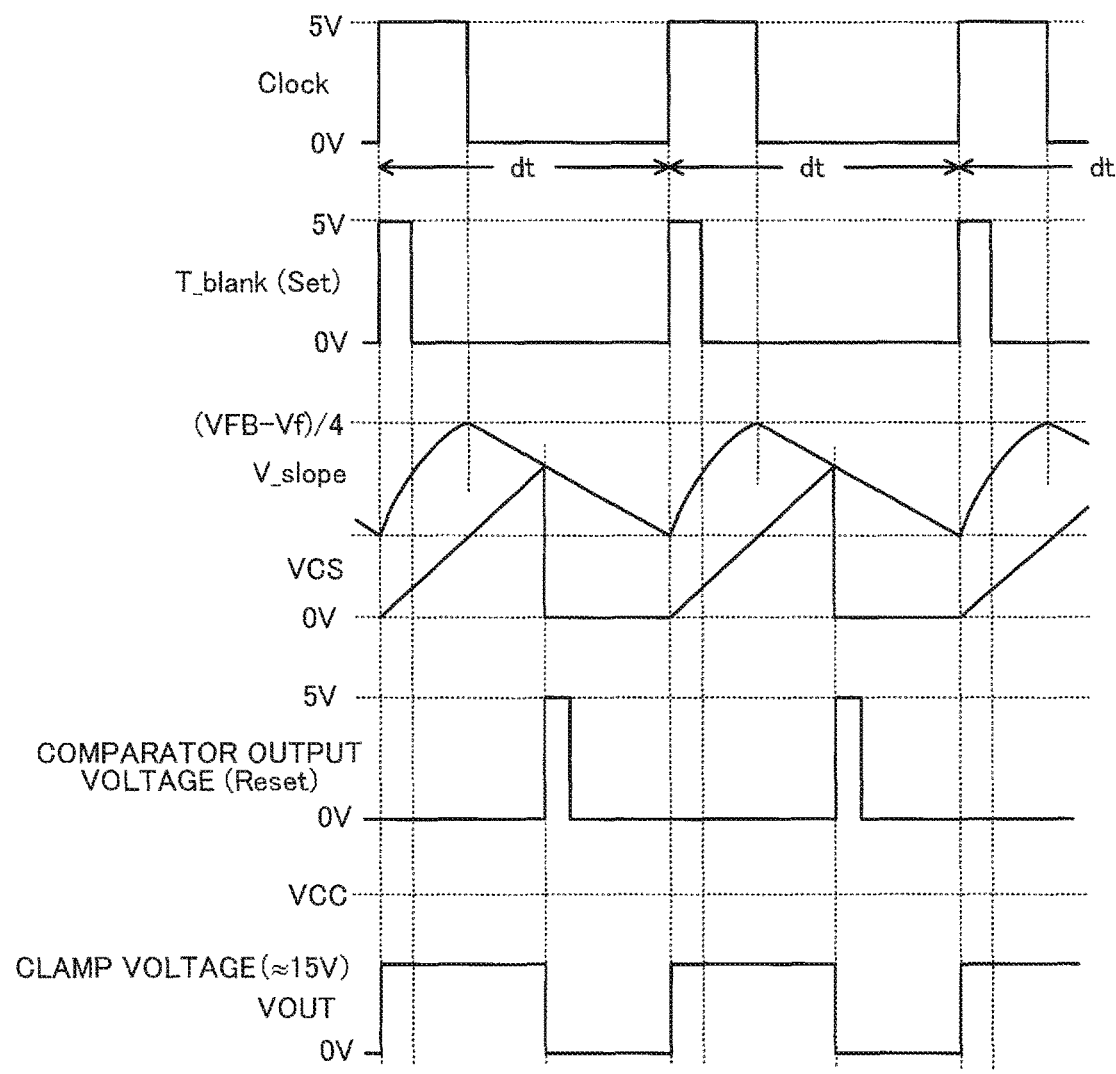
FIG. 3 is a waveform diagram of main parts, illustrating an example of an operation of the control circuit.

FIG. 1 illustrates an example of a configuration of a switching power supply apparatus to which the embodiments discussed herein are applied. FIG. 2 is a block diagram illustrating an example of a configuration of a control circuit. FIG. 3 is a waveform diagram of main parts, illustrating an example of an operation of the control circuit.

In the switching power supply apparatus illustrated in FIG. 1, a commercial alternating-current power supply AC is connected to an alternating-current input terminal of a bridge diode BD1. The positive output terminal of the bridge diode BD1 is connected to one end of a capacitor C1, and the negative output terminal of the bridge diode BD1 is connected to the other end of the capacitor C1. The one end of the capacitor C1 is connected to one end of a primary winding Tn1 of an output transformer T1, and the other end of the primary winding Tn1 is connected to the drain of an N-channel power MOS transistor PT1. The gate of the power MOS transistor PT1 is connected to an output terminal OUT of the control circuit 1 via a resistor R1, and the source of the power MOS transistor PT1 is connected to a ground terminal GND of the control circuit 1 via a current detection resistor R2. A connection point between the source of the power MOS transistor PT1 and the current detection resistor R2 is connected to a current detection terminal CS of the control circuit 1.

One end of an auxiliary winding Tn3 of the output transformer T1 is connected to the anode of a diode D1, and the cathode of the diode D1 is connected to one end of a capacitor C2 and a power supply terminal VCC of the control circuit 1. The other end of the auxiliary winding Tn3 of the output transformer T1 is connected to the other end of the capacitor C2 and the ground terminal GND of the control circuit 1.

One end of a secondary winding Tn2 of the output transformer T1 is connected to the anode of a diode D2, and the cathode of the diode D2 is connected to one end of a capacitor C3 and the positive output terminal of the switching power supply apparatus. The other end of the secondary winding Tn2 of the output transformer T1 is connected to the other end of the capacitor C3 and the negative output terminal of the switching power supply apparatus. The positive output terminal and the negative output terminal of the switching power supply apparatus are connected to a load 2.

Also, the positive output terminal and the negative output terminal are connected to a voltage detection circuit 3. The voltage detection circuit 3 is connected to a light emitting diode of a photocoupler PC1. The collector of a phototransistor of the photocoupler PC1 is connected to a feedback terminal FB of the control circuit 1. The emitter of the phototransistor is connected to the ground terminal GND of the control circuit 1.

In the switching power supply apparatus, an alternating-current voltage from the commercial alternating-current power supply AC is full-wave rectified by the bridge diode BD1, and the full-wave rectified pulsating current is smoothed by the capacitor C1 into a direct-current voltage. The direct-current voltage is supplied to a series circuit constituted by the primary winding Tn1 of the output transformer T1 and the power MOS transistor PT1. The power MOS transistor PT1 is turned on and off by the control circuit 1, and thereby a pulsating current occurs in the secondary winding Tn2 of the output transformer T1. The pulsating current is converted into a direct current by the diode D2 and the capacitor C3, and supplied to the load 2.

An output voltage supplied to the load 2 is detected by the voltage detection circuit 3. The detected value is inputted, as a feedback voltage VFB, to the feedback terminal FB of the control circuit 1 via the photocoupler PC1.

The power supply terminal VCC of the control circuit 1 receives a direct-current voltage that is generated by the auxiliary winding Tn3 of the output transformer T1, the diode D1, and the capacitor C2. The direct-current voltage serves as a power supply voltage of the control circuit 1.

The current detection terminal CS of the control circuit 1 receives a signal generated by the current detection resistor R2 detecting a current that flows through the power MOS transistor PT1, and converting the detected current into a voltage. The signal serves as a current detection signal.

The control circuit 1 uses the feed-backed detection value of the output voltage and the detected current value of the power MOS transistor PT1 to perform pulse width control, and outputs a pulse-width-controlled signal from the output terminal OUT.

As illustrated in FIG. 2, the control circuit 1 contains a feedback circuit 11, an oscillator circuit 12, a pulse blanking circuit 13, a slope creation circuit 14, a comparator 15, a set-dominant RS flip flop 16, and an output stage buffer circuit 17.

As illustrated in FIG. 3, the oscillator circuit 12 outputs a signal, Clock, which has a fixed period dt. The pulse blanking circuit 13 outputs a signal, T_blank, which rises at a timing of a rising edge of the signal Clock. The RS flip flop 16 is set by the signal T_blank, to output a signal, IN, having a high level. The output stage buffer circuit 17 receives the signal IN, and outputs a voltage, VOUT, having a high level to the output terminal OUT to turn on the power MOS transistor PT1. At this time, a peak value of the voltage VOUT outputted by the output stage buffer circuit 17 is clamped at a voltage (e.g. 15V) lower than a voltage VCC (e.g. 30V) of the power supply terminal VCC of the control circuit 1. When the power MOS transistor PT1 is turned on, current flows through the power MOS transistor PT1, the current is converted into a voltage by the current detection resistor R2, and the voltage is applied to the current detection terminal CS. As illustrated in FIG. 3, a voltage VCS at the current detection terminal CS has a waveform that increases from 0V.

The feedback circuit 11 has an NPN transistor NPN1, resistors R11, R12, R13, R14, R15, and a diode D11. The collector of the NPN transistor NPN1 is connected to the power supply terminal VCC; the base of the NPN transistor NPN1 is connected to an internal power supply; and the emitter of the NPN transistor NPN1 is connected to the ground terminal GND via a series circuit constituted by the resistor R11, the diode D11, and the resistors R12, R13, R14, R15. A connection point between the resistor R11 and the diode D11 is connected to the feedback terminal FB; and a connection point between the resistors R14 and R15 is connected to the slope creation circuit 14. Here, since the resistors R12, R13, R14, and R15 have the same resistance value, a voltage inputted to the slope creation circuit 14 is expressed as (VFB−Vf)/4, where Vf is a forward voltage of the diode D11. The NPN transistor NPN1 is an emitter follower for the internal power supply.

As illustrated in FIG. 3, the slope creation circuit 14 generates and outputs a signal, V_slope, which decreases with a constant slope, from a voltage of (VFB−Vf)/4 obtained, as an initial value, at a timing of a falling edge of the signal Clock outputted from the oscillator circuit 12. Here, the voltage (VFB−Vf)/4 inputted to the slope creation circuit 14 decreases when the output voltage from the switching power supply apparatus increases with respect to a target voltage, and increases when the output voltage decreases with respect to the target voltage. The slope with which the voltage (VFB−Vf)/4 decreases is constant, and is not changed.

The comparator 15 receives the signal V_slope at an inversion input terminal of the comparator 15, and also receives the voltage VCS at a non-inversion input terminal of the same. The comparator 15 outputs a low-level output signal when the power MOS transistor PT1 is turned on and the voltage VCS starts increasing from 0V, and outputs a high-level output signal to reset the RS flip flop 16 when the voltage VCS reaches the level of the signal V_slope. This causes the RS flip flop 16 to output the signal IN having a low level, and causes the output stage buffer circuit 17 to output the voltage VOUT having a low level to the output terminal OUT to turn off the power MOS transistor PT1. With this, the current that flows in the power MOS transistor PT1 is stopped, and thereby the voltage VCS at the current detection terminal CS falls to 0V, as illustrated in FIG. 3.

As described above, the voltage VOUT is outputted from the output terminal OUT of the control circuit 1. With the voltage VOUT, the power MOS transistor PT1 is turned on at a timing of the rising edge of the signal Clock, and turned off at a timing at which the level of the signal V_slope and the voltage VCS become equal to each other. In addition, the voltage VOUT is a pulse width modulation (PWM) signal whose pulse width is decreased, when the output voltage is high (i.e. feedback voltage VFB is low), by the maximum value of the signal V_slope being decreased, and is increased, when the output voltage is low (i.e. feedback voltage VFB is high), by the maximum value of the signal V_slope being increased. This allows the output voltage from the switching power supply apparatus to be controlled so that the output voltage is kept at a target voltage.

Next, specific embodiments of the output stage buffer circuit 17 will be described.

Figure 4:
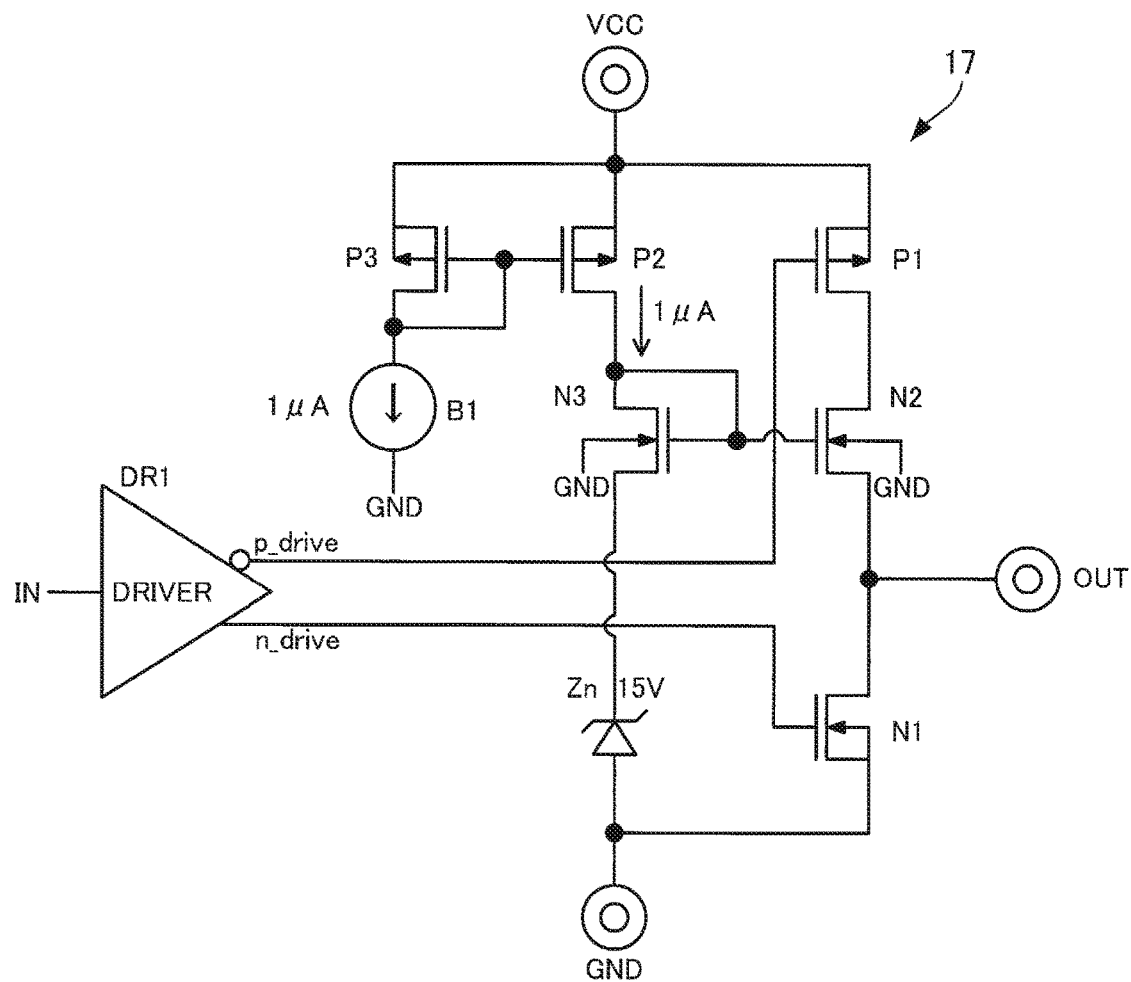
FIG. 4 is a circuit diagram illustrating an example of a configuration of an output stage buffer circuit of a first embodiment.

FIG. 4 is a circuit diagram illustrating an example of a configuration of an output stage buffer circuit of a first embodiment.

The output stage buffer circuit 17 of the first embodiment includes a driver DR1 that receives the signal IN from the RS flip flop 16, and a drive circuit that is driven by signals p_drive and n_drive outputted by the driver DR1. The drive circuit is basically a push-pull circuit constituted by a P-channel MOS transistor P1 that receives the signal p_drive at the gate of the P-channel MOS transistor P1, and an N-channel MOS transistor N1 that receives the signal n_drive at the gate of the N-channel MOS transistor N1. The source of the MOS transistor P1 is connected to the power supply terminal VCC. The source of the MOS transistor N1 is connected to the ground terminal GND. The drain of the MOS transistor N1 is connected to the output terminal OUT.

In addition, a clamp circuit is interposed between a connection point between the drain of the MOS transistor N1 and the output terminal OUT and the drain of the MOS transistor P1. The clamp circuit has N-channel MOS transistors N2 and N3. The drain of the MOS transistor N2 is connected to the drain of the MOS transistor P1. The source of the MOS transistor N2 is connected to the drain of the MOS transistor N1 and the output terminal OUT. The gate of the MOS transistor N2 is connected to the gate and the drain of the MOS transistor N3. Thus, the MOS transistors N2 and N3 constitute a current mirror circuit. In the current mirror circuit, since the MOS transistors N2 and N3 are source followers and their gates are common to each other, source voltages of the MOS transistors N2 and N3 are equal to each other. In addition, the current mirror circuit is not intended to copy the reference current supplied to the MOS transistor N3 in a diode configuration. The MOS transistor N2 is formed almost as large in size as the MOS transistor N1 that flows a large amount of current. In contrast, the MOS transistor N3 is sized to flow a small amount of current. As a result, the current supplied to a load through the MOS transistor N2 is typically lower than a current copied from the current that flows through the MOS transistor N3 according to a size ratio. That is, a value of the current, copied from the current that flows through the MOS transistor N3 according to the size ratio, corresponds to a maximum value of the current that is supplied to a load through the MOS transistor N2. Here, back gates of the MOS transistors N2 and N3 are connected to the ground terminal GND of an integrated circuit that forms the control circuit 1.

The drain of the MOS transistor N3 is connected to a bias circuit that flows a reference current of 1 μA. The bias circuit has P-channel MOS transistors P2 and P3, and a bias source B1. The drain of the MOS transistor P2 is connected to the gate and the drain of the MOS transistor N3. The source of the MOS transistor P2 is connected to the power supply terminal VCC. The gate of the MOS transistor P2 is connected to the gate and the drain of the MOS transistor P3. The source of the MOS transistor P3 is connected to the power supply terminal VCC. The gate and the drain of the MOS transistor P3 is connected to one terminal of the bias source B1, and the other terminal of the bias source B1 is connected to the ground terminal GND of the integrated circuit that forms the control circuit 1. The MOS transistors P2 and P3 are the same in size, and constitute a current mirror circuit. Thus, when a constant current (1 μA) by the bias source B1 flows through the MOS transistor P3, the same amount of current flows in the MOS transistor P2 and is supplied to the MOS transistor N3 of the clamp circuit.

The source of the MOS transistor N3 is connected to the cathode of a Zener diode Zn, and the anode of the Zener diode Zn is connected to the ground terminal GND. The Zener diode Zn operates as a constant-voltage circuit, and is able to produce a stable Zener voltage by the constant current being supplied from the MOS transistor N3 to the Zener diode Zn. In the present embodiment, the Zener voltage across the Zener diode Zn is lower than the voltage VCC (30V) of the power supply terminal VCC, and is set at 15V in consideration of the gate voltage (20V or less) of the inexpensive power MOS transistor PT1. Thus, a source voltage Vs (N3) of the MOS transistor N3 is 15V.

Here, the gate voltage Vg(N2) of the MOS transistor N2 is calculated by $$Vg(N2)=VOUT(H)+Vgs(N2) \quad (1)$$

where Vgs(N2) is a voltage between the gate and the source of the MOS transistor N2, and VOUT(H) is a high-level voltage of the output terminal OUT. On the other hand, since the gates of the MOS transistors N2 and N3 are common to each other, the gate voltage Vg(N3) of the MOS transistor N3 is calculated by $$Vg(N3)=Vg(N2) \quad (2)$$

and $$Vg(N3)=Vs(N3)+Vgs(N3) \quad (3)$$

where Vgs(N3) is a voltage between the gate and the source of the MOS transistor N3. By equations (1) to (3), the following equation is given:

$$VOUT(H)=Vs(N3)+Vgs(N3)-Vgs(N2). \quad (4)$$

Here, since the source voltage Vs(N3) of the MOS transistor N3 equals the Zener voltage (15V) of the Zener diode Zn, the voltage VOUT is expressed as $$VOUT(H)=15V+[Vgs(N3)-Vgs(N2)]. \quad (5)$$

In order to flow current from the power supply terminal VCC to the output terminal OUT by turning on the MOS transistor P1 and turning off the MOS transistor N1, the voltage Vgs(N2) needs to satisfy the following expression:

$$Vgs(N2) \geq Vth(N2) \quad (6)$$

where Vth(N2) is a threshold voltage of the MOS transistor N2. In equation (6), when zero amperes of current flows from the power supply terminal VCC to the output terminal OUT, Vgs (N2) equals Vth(N2).

By the way, the gate and the drain of the MOS transistor N3 are shorted, and the MOS transistor N3 is in a saturation state. In addition, the constant current of 1 μA flows into the MOS transistor N3 from the MOS transistor P2. Thus, the MOS transistor N3 has its fixed parameters that satisfy the following equation:

$$1\ \mu A=[\mu n \cdot Cox \cdot (W/L)/2] \times [Vgs(N3)-Vth(N3)]^2 \quad (7)$$

where the above equation expresses the relationship between a saturation current of 1 μA and the voltage Vgs(N3) between the gate and the source of the MOS transistor N3, and where μn is a mobility of electrons, Cox is a gate oxide capacitance per unit area of the MOS transistor N3, W/L is a gate width divided by a gate length of the MOS transistor N3, and Vth(N3) is a threshold voltage of the MOS transistor N3.

When equation (6) of the MOS transistor N2 is substituted into equation (5), the voltage VOUT(H) is expressed as the following expression:

$$VOUT(H) \leq 15V + Vgs(N3) - Vth(N2) \quad (8)$$

As is seen, the high-level voltage VOUT(H) at the output terminal OUT is not larger than a value calculated by 15V+Vgs(N3)−Vth(N2). Here, the voltage Vgs(N3), in equation (8), between the gate and the source of the MOS transistor N3 is determined to satisfy equation (7), based on a process, the constant current of 1 μA that is set, and the value of W/L of the MOS transistor N3. In addition, the threshold voltage Vth(N2) of the MOS transistor N2 is determined based on the process. Furthermore, according to a simulation result, Vgs(N3)−Vth(n2) of equation (8) satisfies the following expression:

$$|Vgs(N3) - Vth(N2)| < 1V$$

where the substrate effect of the MOS transistors N2 and N3 is considered. From the above, the high-level voltage VOUT (H) of the output terminal OUT is clamped at about 15V, which is lower than the voltage (VCC) of the power supply terminal VCC.

Figure 5:
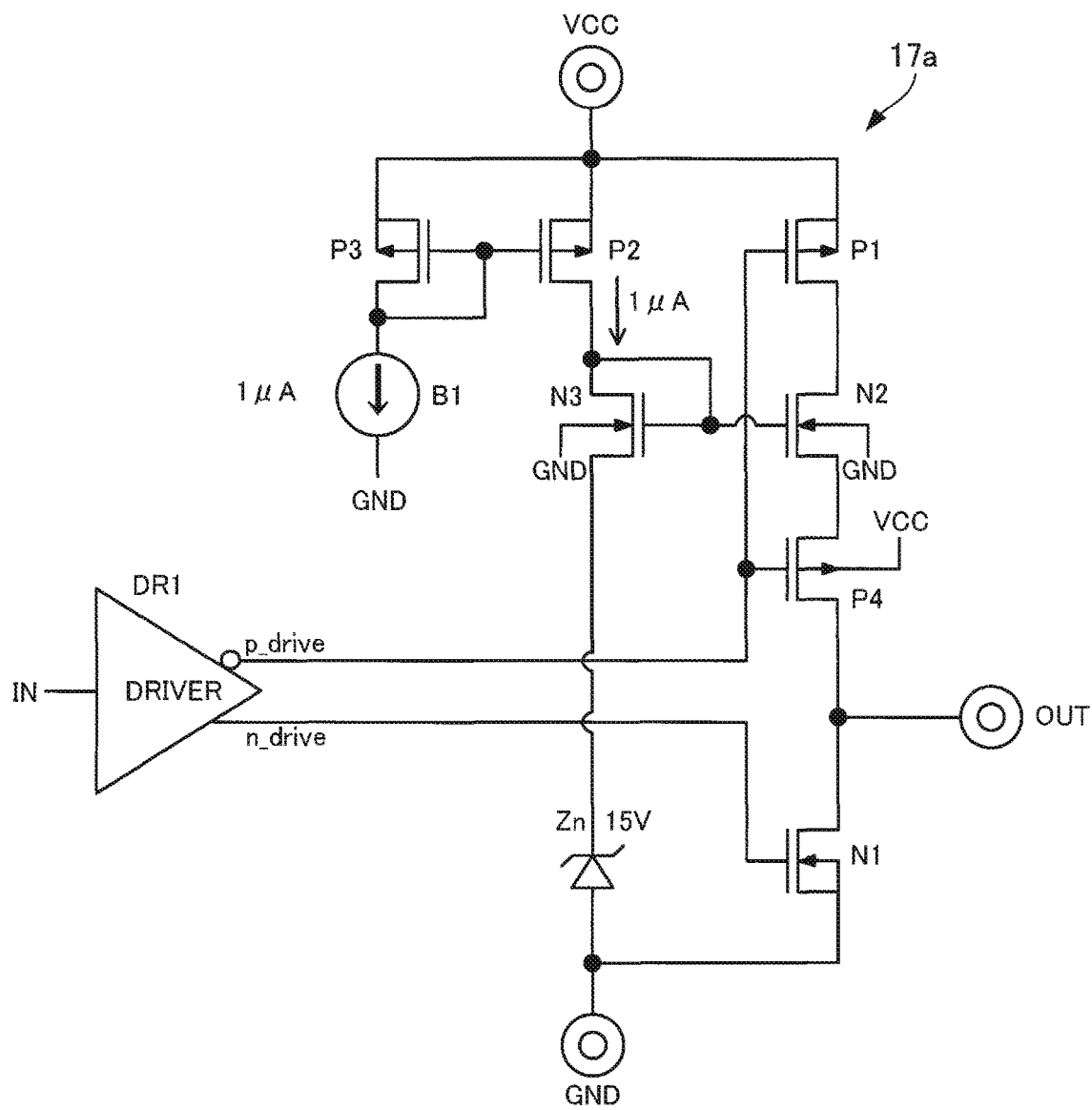
FIG. 5 is a circuit diagram illustrating an example of a configuration of an output stage buffer circuit of a second embodiment.

FIG. 5 is a circuit diagram illustrating an example of a configuration of an output stage buffer circuit of a second embodiment. In FIG. 5, a component which is identical or equivalent to a component illustrated in FIG. 4 is denoted by an identical symbol and the detailed description thereof will be omitted as appropriate.

An output stage buffer circuit 17a of the second embodiment includes a P-channel MOS transistor P4 added to the output stage buffer circuit 17 of the first embodiment. The MOS transistor P4 is provided between the MOS transistor N2 of the clamp circuit and the connection point between the drain of the MOS transistor N1 and the output terminal OUT. The MOS transistor P4 is provided such that: the source of the MOS transistor P4 is connected to the source of the MOS transistor N2; the drain of the MOS transistor P4 is connected to the connection point between the drain of the MOS transistor N1 and the output terminal OUT; and the gate of the MOS transistor P4 is connected to the gate of the MOS transistor P1. A back gate of the MOS transistor P4 is connected to the power supply terminal VCC.

In the output stage buffer circuit 17a, the MOS transistor P4 is turned on and off, by the signal p_drive outputted by the driver DR1, simultaneously with the MOS transistor P1 being turned on and off. With this, when the MOS transistor P1 is turned off from on, and when the MOS transistor N1 is turned on from off, the MOS transistor N2 and the output terminal OUT is separated from each other by the MOS transistor P4. This makes it possible to prevent unstable operation of the clamp circuit when the switching power supply apparatus performs high-speed switching operation.

In contrast, the output stage buffer circuit 17 of the first embodiment, which does not include the MOS transistor P4, operates as below. Suppose that the MOS transistor P1 is turned on; the MOS transistor N1 is turned off; and the output terminal OUT is in a high-level state where VOUT=H. Then, when the MOS transistor P1 is turned off, the MOS transistor N1 is turned on, and the output terminal OUT is changed into a low-level state where VOUT=L, the source voltage of the MOS transistor N2 changes rapidly. This is because the voltage VOUT serves also as the source voltage of the MOS transistor N2. With this, current flows through a capacitance (parasitic capacitance) between the gate and the source of the MOS transistor N2, rapidly lowering the gate voltage of the MOS transistors N2 and N3.

Then, the constant current of 1 μA from the MOS transistor P2 charges the capacitance between the gate and the source of the MOS transistor N2 and the capacitance between the gate and the source of the MOS transistor N3, gradually increasing the gate voltage of the MOS transistors N2 and N3. When high-speed switching is performed, the voltage VOUT turns to a high level (VOUT=H) before the gate voltage of the MOS transistors N2 and N3 fully rises. In this case, however, even when the MOS transistor P1 is turned on, a sufficient amount of current does not flow in the MOS transistor N2 because the gate voltage of the MOS transistor N2 has a low level. This causes delay of the rising edge of the voltage VOUT. When the switching frequency is high, the voltage VOUT falls to a low level (VOUT=L) before reaching a high level, causing its continuous low level state (VOUT=L).

In contrast to this, the MOS transistor P4 is able to prevent the above problem because, when the voltage VOUT is low (VOUT=L), the MOS transistor P4 is turned off so that the source voltage of the MOS transistor N2 does not become low.

Figure 6:
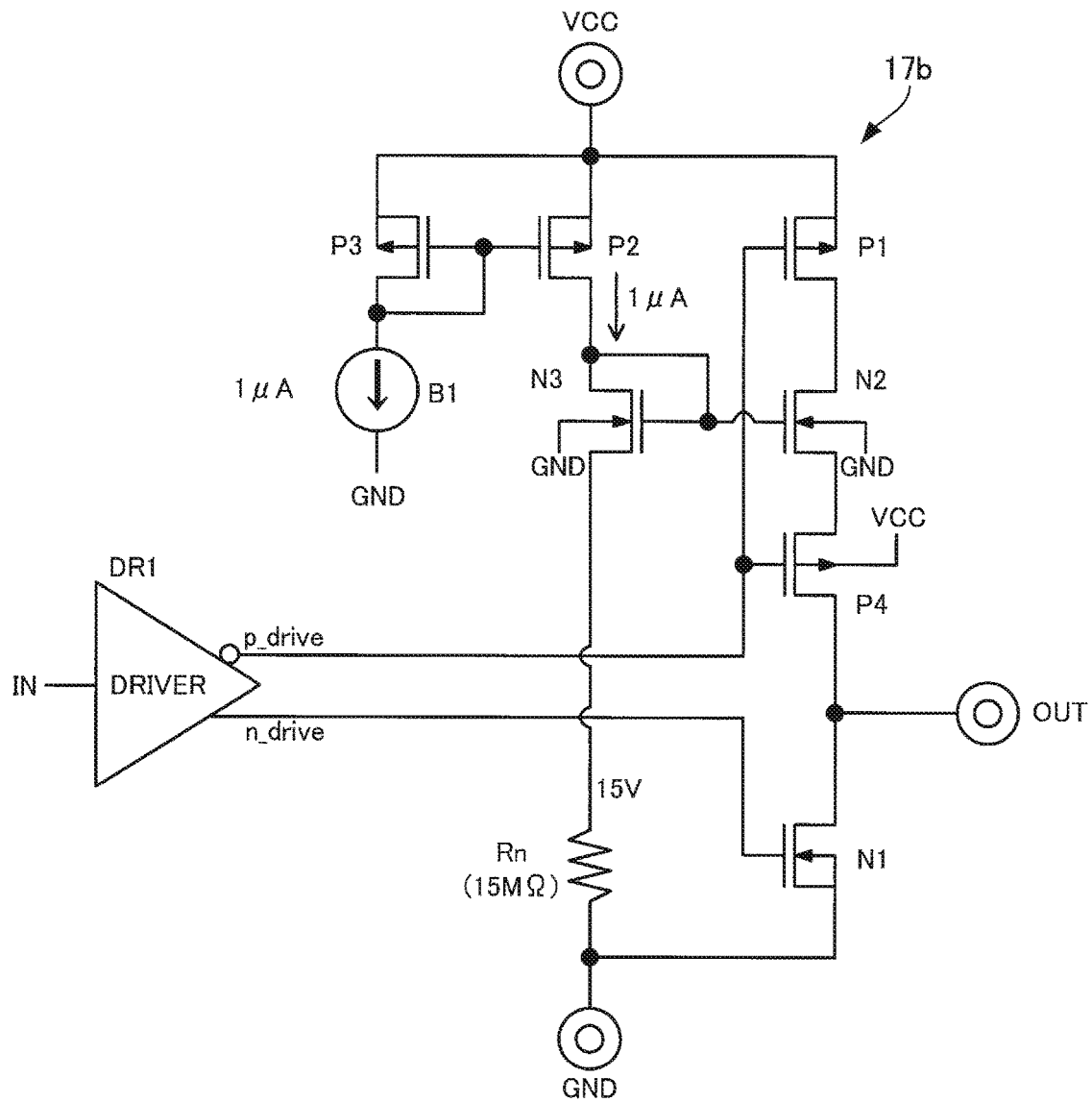
FIG. 6 is a circuit diagram illustrating an example of a configuration of an output stage buffer circuit of a third embodiment.
Figure 7:
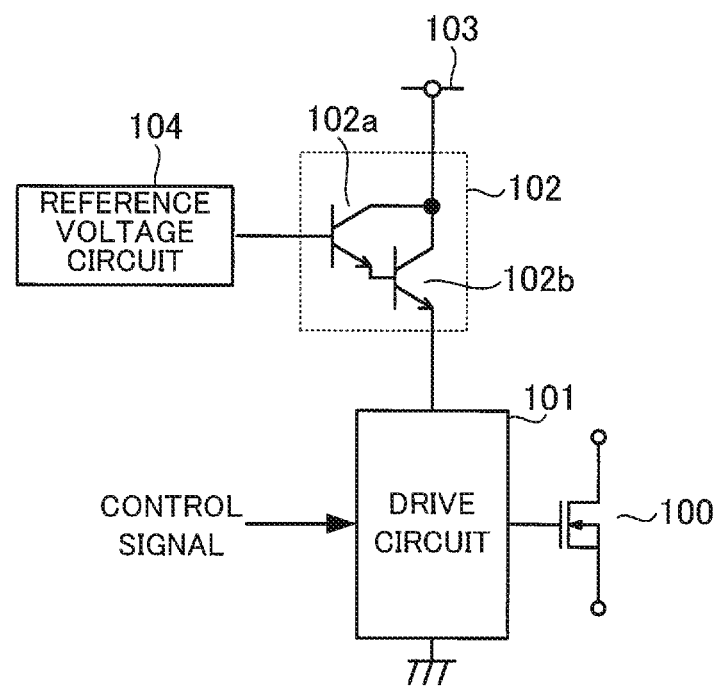
FIG. 7 illustrates an example of a drive circuit of a conventional output stage buffer circuit.

FIG. 6 is a circuit diagram illustrating an example of a configuration of an output stage buffer circuit of a third embodiment. In FIG. 6, a component which is identical or equivalent to a component illustrated in FIG. 5 is denoted by an identical symbol and the detailed description thereof will be omitted as appropriate.

An output stage buffer circuit 17b of the third embodiment includes a resistor Rn in place of the Zener diode Zn, which is used as the constant-voltage circuit in the output stage buffer circuits 17 and 17a of the first and the second embodiments.

The current mirror circuit, constituting the clamp circuit, is supplied with the constant current of 1 μA as the reference current. The constant current is further supplied to the resistor Rn. In the output stage buffer circuit 17b, the resistance value of the resistor Rn is 15 megaohms (MΩ) to produce a voltage drop value of 15V so that the source voltage of the MOS transistor N3 is set at 15V.

Although the voltage across the constant-voltage circuit is 15V in the above-described embodiment, the voltage is not limited to this value. Also, although the constant-voltage circuit is constituted by the Zener diode Zn or the resistor Rn, the constant-voltage circuit may be constituted by a more precise circuit. Examples of the more precise circuit include a bandgap reference circuit which uses a physical property, called bandgap voltage, of silicon, which is used as a material for integrated circuits.

The above-described output stage buffer circuit is configured such that the clamp circuit is constituted by the current mirror circuit, and that the components constituting the current mirror circuit have an identical substrate effect. With this, the output stage buffer circuit has an advantage in which an upper limit of the output voltage is easily and reliably clamped at a voltage of the constant-voltage circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An output stage buffer circuit having a power supply terminal, a ground terminal and an output terminal, the circuit comprising:
    a first P-channel Metal-Oxide-Semiconductor Field-Effect Transistor (MOSFET), a source thereof being connected to the power supply terminal;
    a first N-channel MOSFET, a source and a drain thereof being respectively connected to the ground terminal and the output terminal, the first N-channel MOSFET and the first P-channel MOSFET constituting a push-pull circuit;
    a second N-channel MOSFET disposed between a drain of the first P-channel MOSFET and a connection point between the drain of the first N-channel MOSFET and the output terminal;
    a third N-channel MOSFET, a source thereof having applied thereto a constant voltage that is lower than a voltage received at the power supply terminal, a drain thereof being configured to receive a constant current, the second and third N-channel MOSFETs constituting a current mirror circuit;
    a constant-voltage circuit that supplies the constant voltage to the third N-channel MOSFET; and
    a bias circuit that supplies the constant current to the third N-channel MOSFET.

2. The output stage buffer circuit according to claim 1, wherein:
    the bias circuit includes a second P-channel MOSFET, a third P-channel MOSFET, and a bias source, wherein
    the second P-channel MOSFET and the third P-channel MOSFET constitute another current mirror circuit;
    a source of each of the second P-channel MOSFET and the third P-channel MOSFET is connected to the power supply terminal; and
    the bias source is connected to the third P-channel MOSFET.

3. The output stage buffer circuit according to claim 2, wherein the third P-channel MOSFET is in a diode configuration by connecting a gate and a source of the third P-channel MOSFET.

4. The output stage buffer circuit according to claim 1, further comprising a fourth P-channel MOSFET that is disposed between a source of the second N-channel MOSFET and the connection point between the drain of the first N-channel MOSFET and the output terminal, and that is operated by a gate signal that is identical to a gate signal for the first P-channel MOSFET.

5. The output stage buffer circuit according to claim 1, wherein the constant-voltage circuit includes a Zener diode that receives a current from the third N-channel MOSFET.

6. The output stage buffer circuit according to claim 1, wherein the constant-voltage circuit includes a resistor that receives a current from the third N-channel MOSFET.

7. The output stage buffer circuit according to claim 1, wherein
    the constant-voltage circuit has a low electric-potential side and a high electric-potential side, and
    a substrate electric potential of the second N-channel MOSFET and the third N-channel MOSFET is identical to an electric potential of the constant-voltage circuit on the low electric-potential side.

8. The output stage buffer circuit according to claim 1, wherein the third N-channel MOSFET is in a diode configuration by connecting a gate and a source of the third N-channel MOSFET.

* * * * *